(12) United States Patent
Guo et al.

(10) Patent No.: US 10,394,740 B1
(45) Date of Patent: Aug. 27, 2019

(54) SIGNAL LINE SWITCH ARRANGEMENT WITH MULTIPLE PATHS BETWEEN A CHARGE PUMP AND A TRANSISTOR CONTROL TERMINAL

(71) Applicant: TEXAS INSTRUMENTS INCORPORATED, Dallas, TX (US)

(72) Inventors: Shita Guo, Dallas, TX (US); Yanli Fan, Dallas, TX (US); Huanzhang Huang, Plano, TX (US); Yonghui Tang, Plano, TX (US); Yanfei Jiang, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/126,665

(22) Filed: Sep. 10, 2018

(51) Int. Cl.
*H03K 17/00* (2006.01)
*G06F 13/40* (2006.01)
*G06F 13/42* (2006.01)
*H02M 3/07* (2006.01)
*H02M 1/14* (2006.01)

(52) U.S. Cl.
CPC ...... *G06F 13/4022* (2013.01); *G06F 13/4282* (2013.01); *H02M 1/143* (2013.01); *H02M 3/07* (2013.01); *G06F 2213/0042* (2013.01)

(58) Field of Classification Search
CPC ........ G06F 1/08; G06F 3/222; G06F 13/4022; G06F 13/4282; G06F 2213/0042; H02M 1/143; H02M 3/07; H02M 3/025; H02M 3/073; H03K 5/1252; H03K 17/693; H03K 17/6872; H03K 17/005
See application file for complete search history.

(56) References Cited

U.S. PATENT DOCUMENTS 9,124,272 B2 * 9/2015 Fukami ............... H01L 27/0883
10,187,055 B2 * 1/2019 Dhamdhere ......... H03K 17/687

OTHER PUBLICATIONS

"TS3USCA4 USP Type-C SBU Multiplexer with MIC/AGND." Texas Instruments. SLLSF73—Feb. 2018.

* cited by examiner

*Primary Examiner* — Long Nguyen
(74) *Attorney, Agent, or Firm* — John R. Pessetto; Charles A. Brill; Frank D. Cimino

(57) ABSTRACT

An apparatus includes a transistor with a control terminal, a first current terminal, and a second current terminal. The apparatus also includes a charge pump coupled to the control terminal of the transistor via a first and second paths. The first path comprises a first resistor and the second path comprises a second resistor in series with a diode. The first resistor has a higher resistance value than the second resistor.

20 Claims, 4 Drawing Sheets

US 10,394,740 B1

SIGNAL LINE SWITCH ARRANGEMENT WITH MULTIPLE PATHS BETWEEN A CHARGE PUMP AND A TRANSISTOR CONTROL TERMINAL

BACKGROUND

The proliferation of networked electronic devices and components continues along with related efforts to increase signaling speed while maintaining signal integrity. Also, there is an ongoing need for components such as repeaters to extend signaling (due to attenuation) and switches (e.g., multiplexers) to provide system designers with options for connecting available signal lines. As an example, a switch along a signal line is imperfect and therefore affects signals being conveyed. Example effects include attenuation due to "on" resistivity (R_ON) of the switch, and signal distortion (e.g., quantified as total harmonic distortion or "THD") due to output ripple of the charge pump.

An example scenario involves an electronic device with a Universal Serial Bus (USB) Type-C port and a sideband use (SBU) multiplexer between the audio and high-speed signal lines. Existing switch designs include use of a large field-effect transistor (FET) or use of a charge pump to drive a smaller transistor. The large FET design has an undesirably low bandwidth due to capacitive loading issues, resulting is distortion to high-speed signals. Meanwhile, the charge pump with smaller transistor design offers low R_ON, low capacitive loading, and thus high bandwidth, but adds undesirable noise to signals due to charge pump ripple. Efforts to improve switch designs and related devices are ongoing.

SUMMARY

In accordance with at least one example of the disclosure, an apparatus comprises a switch arrangement for a signal line. The switch arrangement comprises a transistor with a control terminal, a first current terminal, and a second current terminal. The switch arrangement also comprises a charge pump coupled to the control terminal of the transistor via first and second paths, wherein the first path comprises a first resistor, wherein the second path comprises a second resistor in series with a diode, and wherein the first resistor has a higher resistance value than the second resistor.

In accordance with at least one example of the disclosure, a multiplexer device comprises a signal line and a switch arrangement for the signal line. The switch arrangement comprises a transistor with a control terminal, a first current terminal, and a second current terminal. The switch arrangement also comprises a charge pump coupled to the control terminal of the transistor via first and second paths, wherein the first path comprises a first resistor, wherein the second path comprises a second resistor in series with a diode, and wherein the first resistor has a higher resistance value than the second resistor.

In accordance with at least one example of the disclosure, an apparatus comprises a signal line and a switch arrangement for the signal line. The switch arrangement comprises a transistor with a control terminal, a first current terminal, and a second current terminal. The switch arrangement also comprises a charge pump coupled to the control terminal of the transistor via a noise isolation path in parallel with one-way charging path having a lower resistance than the noise isolation path.

BRIEF DESCRIPTION OF THE DRAWINGS

For a detailed description of various examples, reference will now be made to the accompanying drawings in which.

DETAILED DESCRIPTION

Figure 1:
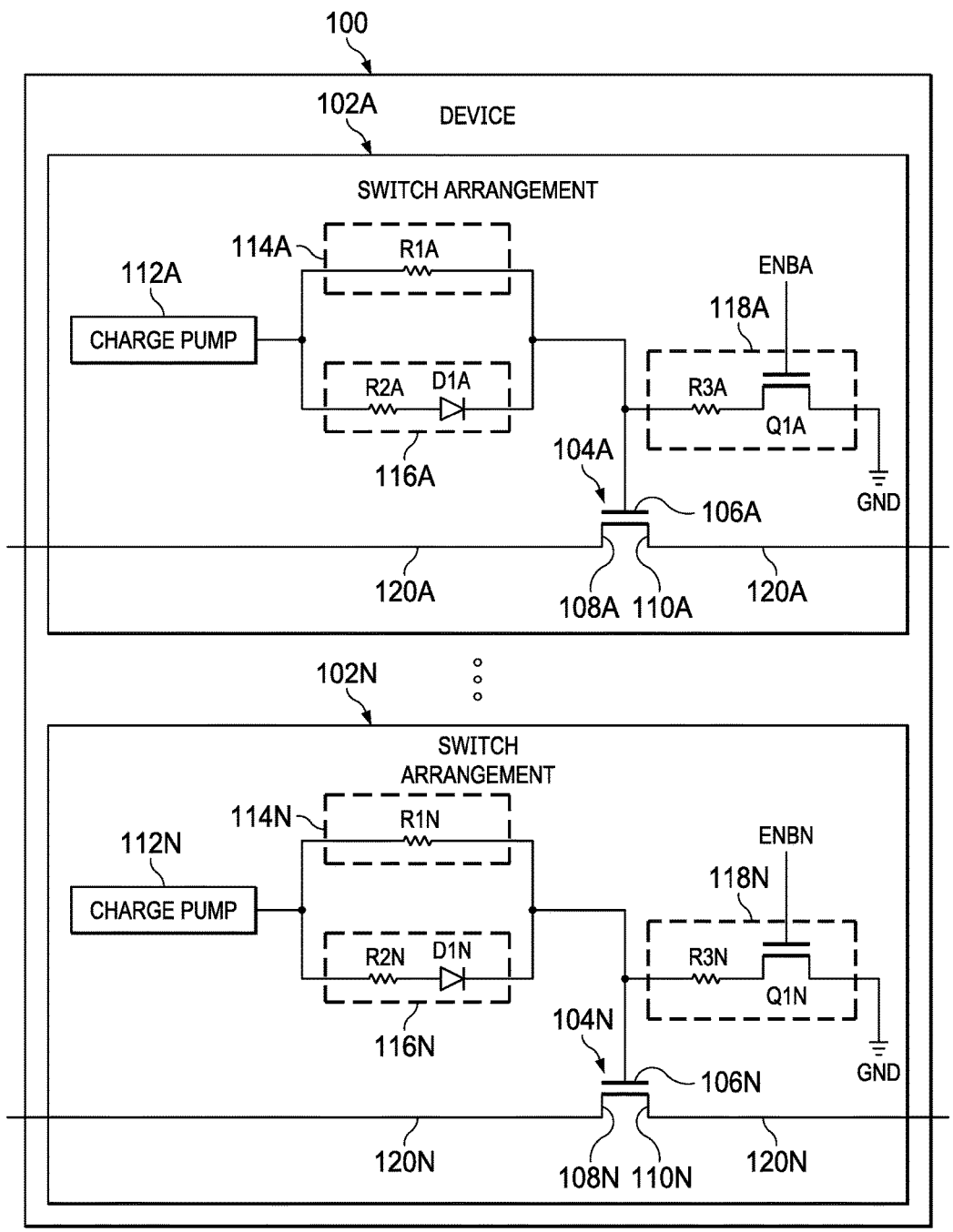
FIG. 1 shows a block diagram of an electrical device in accordance with various examples.

Disclosed herein is a switch arrangement topology for a signal line, where the switch arrangement provides low "on" resistance (R_ON), low total harmonic distortion (THD), and high bandwidth. More specifically, an example switch arrangement has an R_ON below 60 ohms, a THD below 0.008%, and a bandwidth above 500 MHz. For different switch arrangements, target thresholds for R_ON, THD, and bandwidth vary depending on the design criteria for signaling on a given signal line. Likewise, the arrangement and values of components to achieve the target thresholds will vary.

In at least some examples, a switch arrangement includes a main transistor (e.g., a FET switch) and a charge pump coupled to a control terminal of the main transistor via a first path (sometimes referred to herein as a "noise isolation" path) and a second path (sometimes referred to herein as a "one-way charging" path). In one example, the first path includes a first resistor. Meanwhile, the second path includes a second resistor and a diode, where the second resistor has a resistance value that is less than the first resistor. In some examples, the second path also includes a transistor, where the diode couples to the current terminals of the transistor (the one-charging path includes diode-connected transistor). In some examples, the first resistor has a resistance value that is at least 100 times greater than the resistance value of the second resistor.

In at least some examples, the switch arrangement also includes a discharge path coupled to the control terminal of the main transistor. As an example, the discharge path includes a discharge transistor with a control terminal, a first current terminal, and a second current terminal, where the first current terminal of the discharge transistor couples to the control terminal of the main transistor via a third resistor, and where the second current terminal of the discharge transistor couples to a ground node. In at least some examples, a resistance value of the first resistor is at least 65 times the resistance value of the third resistor. The control terminal for the discharge transistor couples selectively receives a control signal (ENB), resulting in discharge at the control terminal of the main transistor being directed to the ground node, such that "on-to-off" transitions of the main transistor are faster than a predetermined threshold. In some examples, the ENB signal is also used to open or close a switch between the charge pump and the control terminal of the main transistor (e.g., when ENB is high, the charge pump is disconnected from the control terminal of the main transistor and discharge at the control terminal of the main transistor occurs by its connection to a ground node via the discharge path).

In at least some examples, the switch arrangement includes a fourth resistor coupled between a body of the main transistor and the charge pump. In some examples, the fourth resistor and the first resistor have approximately the same resistance value. When the main transistor is turned "on", the body is biased to the first and second current terminals of the main transistor to eliminate the body effect and reduce the threshold voltage. When the main transistor is turned "off", the body is biased to ground to increase isolation of the main transistor. To provide a better understanding, various switch arrangement options and scenarios are described using the figures as follows.

FIG. 1 shows a block diagram of an electrical device 100 in accordance with various examples. In one example, the electrical device 100 represents a packaged or unpackaged integrated circuit. In another example, the electrical device 100 represents a computer, laptop, tablet, or other consumer device. As shown, the electrical device 100 comprises a plurality of switch arrangements 102A-102N for respective signal lines 120A-120N. In different examples, the electrical device 100 includes other components (e.g., components that provide signals to one or more of the signal lines 120A-120N and/or components that receive/use signals conveyed via one or more of the signal lines 120A-120N).

In FIG. 1, each of the switch arrangements 102A-102N includes a respective main transistor 104A-104N, where each of the main transistors 104A-104N includes a respective control terminal 106A-106N, a respective first current terminal 108A-108N, and a respective second current terminal 110A-110N. As shown, each of the control terminals 106A-106N couples to a respective charge pump 112A-112N via a respective first path 114A-114N and a respective second path 116A-116N. Each of the first paths 114A-114N includes a respective first resistor (labeled R1A-R1N). Meanwhile, each of the second paths 116A-116N includes a respective second resistor (labeled R2A-R2N) and a respective diode (labeled D1A-D1N). Each of the switch arrangements 102A-102N also includes a discharge path 118A-118N coupled to a respective control terminal 106A-106N. Each of the discharge paths 118A-118N includes a respective third resistor (labeled R3A-R3N) and discharge transistor (labeled Q1A-Q1N). More specifically, each of the discharge transistors Q1A-Q1N has a first current terminal coupled to a respective third resistor, and a second current terminal coupled to a ground node. Each control terminal for the discharge transistors Q1A-Q1N receives a respective control signal (ENBA-ENBN).

In operation, the charge pump 112A provides charge to the control terminal 106A of the main transistor 104A via the first path 114A and the second path 116A. With the first path 114A (a noise isolation path), charge pump ripple or noise is isolated from the control terminal 106A. With the second path 116A (a one-way charging path) being lower resistivity than the first path 114A, the time needed to charge the control terminal 106A (to transition from an "off" state to an "on" state) is reduced compared to using one only the first charge path 114A. Once the control terminal 106A of the main transistor 104A receives sufficient charge, the signal line 120A becomes continuous (the main transistor 104A is turned on) such that signals pass between the first current terminal 108A and the second current terminal 110A. The main transistor 104A stays on to enable signaling along the signal line 120A until the control signal ENBA is used to activate the discharge path 118A and/or disconnect the charge pump 112A (e.g., using a switch between the charge pump 112A and the paths 114A and 116A, where the switch is controlled by ENBA). The operations of the other switch arrangements 102B-102N follow the example given for the switch arrangement 102A, where each of the other switch arrangements 102B-102N can be operated independently using its respective components to selectively enable or disable signaling along each of the respective signal lines 120B-120N.

In some examples, the values for R1A-R1N are the same (e.g., 2 M ohms), the values for R2A-R2N are the same (e.g., 20 k ohms), and the values for R3A-R3N are the same (e.g., 30 k ohms). In other examples, the resistors values used for different switch arrangements vary from each other depending on issues such as the signaling frequency used for the different signal lines 120A-120N and/or other criteria. In some examples, each of the first resistors R1A-R1N has a resistance value (e.g., 2 M ohms) that is at least 100 times larger than the resistance value for each of the second resistors (e.g., 20 k ohms). Also, in some examples, each of the first resistors R1A-R1N has a resistance value (e.g., 2 M ohms) that is at least 65 times larger than the resistance value for each of the third resistors (e.g., 30 k ohms).

In accordance with some examples, values for R1 and R4 are selected based on a desired level of attenuation for the output ripple of the charge pump to achieve a target threshold THD performance. In different examples, the values of R1 and R4 range from several hundred kΩ to several MΩ. In one example design, R1 and R4 are selected to have a value of 2 MΩ, which achieves a THD of 0.0012%. Note: R1 and R4 do not necessarily have the same values. R2 is determined by a desired speed for charging the control terminal of the main transistor to turn on the signal path (i.e., a threshold turn-on time is targeted). In different examples, the value of R2 ranges from 0 to tens of kΩ. In one example design, R2 is selected to have a value of 20 kΩ, which achieves a turn-on time of 8.2 μs. In some examples, the value of R2 is selected to target a turn-on time of 15 μs (e.g., the control terminal of the main transistor needs to be charged from 0V to 8V within 15 μs). R3 is determined by a desired speed for discharging the control terminal of the main transistor to turn off the signal path (i.e., a threshold turn-off time is targeted). In different examples, the value of R3 ranges from 0 to tens of kΩ. In one example design, R3 is selected to have a value of 30 kΩ, which achieves a turn-off time of 4.2 μs. In some examples, the value of R3 is selected to target a turn-off time of 4.5 μs (the control terminal of the main transistor needs to be discharged from 8V to 0V within 4.5 μs).

As an example scenario, the turn-on time corresponds to a delay between when a user plugs in a microphone and when the microphone is usable. Thus, the targeted turn-on time is usually selected by system designers to be sufficiently small so as not to be noticed (e.g., in the μs or ms range). Regarding turn-off time, a multiplexer enables only one path can be turned on at a time. As a result, a short target turn-off time is desirable in a multiplexer scenario, where one path is turned off in order to turn on another path (other multiplexer paths will not be usable until the turn-off time for the enabled path is complete).

Figure 2:
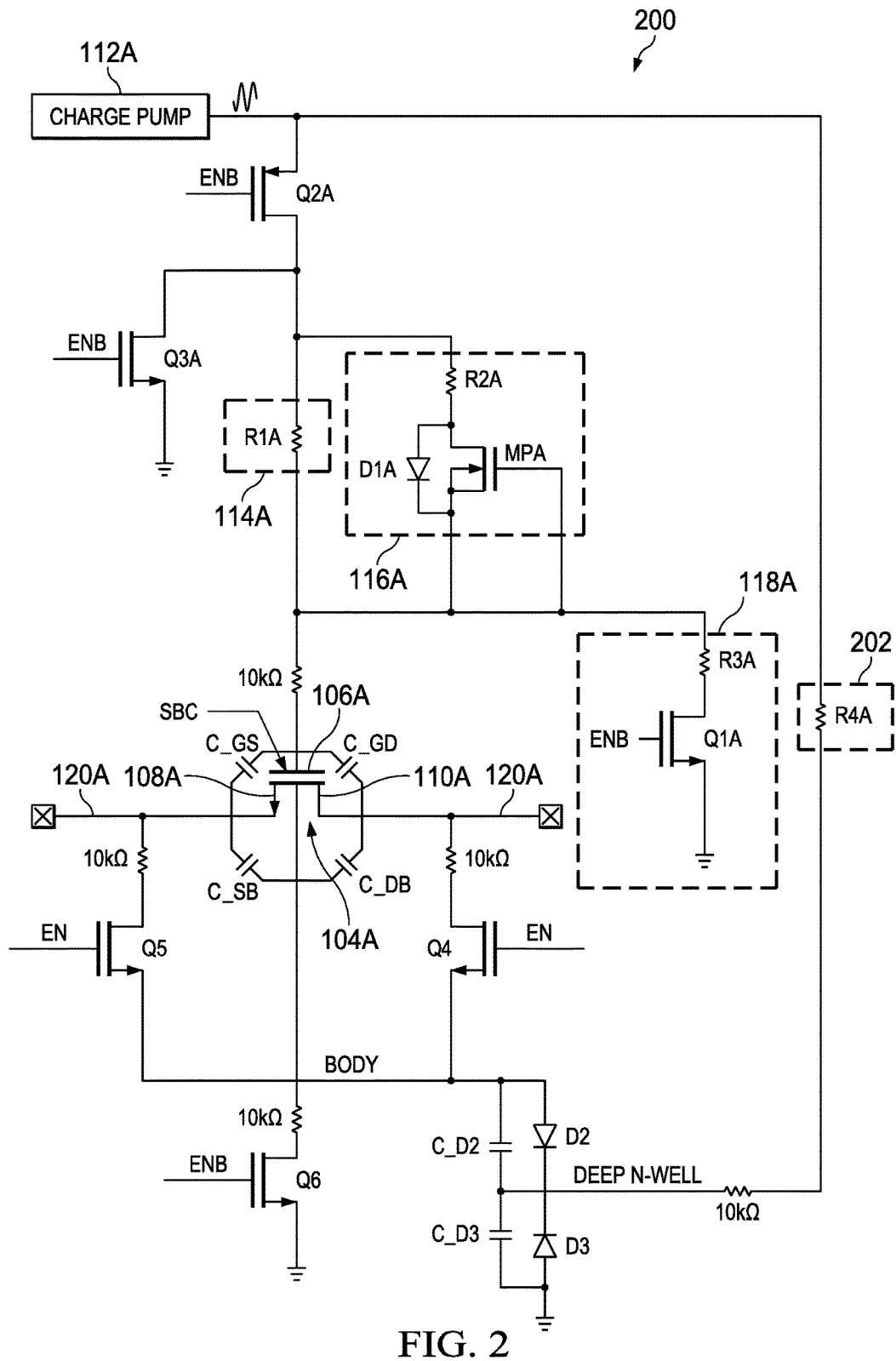
FIG. 2 shows a schematic diagram of a switch arrangement in accordance with various examples.

FIG. 2 shows a schematic diagram of a switch arrangement 200 in accordance with various examples. The switch arrangement 200 of FIG. 2 is an example of the switch arrangement 102A in FIG. 1. In some examples, each of the switch arrangements 102A-102N in FIG. 1 follow the same schematic diagram as the switch arrangement 200 represented in FIG. 2

In FIG. 2, various components introduced in FIG. 1 are again represented, including the charge pump 112A, the first path 114A with R1A, the second path 116A with R2A and D1A, the discharge path 118A with R3A and Q1A, and the main transistor 104A with the control terminal 106A, the first current terminal 108A, and the second current terminal 110A. In addition, FIG. 2 shows another noise isolation path 202 with a resistor R4A coupled between a body of the main transistor 104A and the charge pump 112A. The noise isolation path 202 attenuates the output ripple of the charge pump, and the value of R4A is selected to achieve a target THD as described herein.

The behavior of the main transistor 104A is also represented using various components, including capacitors (C_GS, C_GD, C_SB, C_DB, C_D2, C_D3), resistors (labeled as 10 k ohm resistors), transistors (Q4, Q5, Q6), and diodes (D2 and D3). More specifically, C_GS represents a capacitance between a gate and source of the main transistor 104A, C_GD represents a capacitance between a gate and drain of the main transistor 104A, C_SB represents a capacitance between a source and body of the main transistor 104A, C_DB represents a capacitance between a drain and body of the main transistor 104A. The resistors, Q4, Q5, Q6, D2, D3, C_D2, and C_D3 represent various resistances, capacitances, and current flows for the main transistor 104A.

In operation, the charge pump 112A, the first path 114A, the second path 116A, the discharge path 118A, and deep N-well biasing of the main transistor 104A (represented using D2, D3, C_D2, and C_D3) enable signaling along the signal line 120A, where R_ON is less than a threshold (e.g., 60 ohms), THD is less than a threshold (e.g., 1%), and bandwidth is greater than a threshold (e.g., 400 KHz). More specifically, the charge pump 112A increases the gate voltage (the voltage at the control terminal 106A) of the main transistor 104A so that R_ON is low. With the charge pump 112A, the size of the main transistor 104A is relatively small compared to some other switch arrangement topologies, which decreases that values of C_GS, C_GD, C_SB, and C_DB, resulting in higher bandwidth. The charge pump 112A also includes the deep N-well voltage of the main transistor 104A. As the reverse bias voltages of the body diodes (D2 and D3) increases, the related parasitic capacitances (C_D2 and C_D3) decrease. Thus, the capacitive load of the signaling line 120A is lower, and the bandwidth is higher. The first path 114A and the noise isolation path 202 reduce charge pump ripple at the control terminal 106A of the main transistor 104A, which reduces THD.

When the main transistor 104A is turned on, the body is biased to the source and drain nodes (the first and second current terminals 108A and 110A) to eliminate the body effect and reduce the threshold voltage. When the main transistor 104A is turned off, the body is biased to ground to increase the isolation of the main transistor 104A in the off state.

With regard to the first path 114A, positioning R1A between the charge pump 112A and the gate node (the control terminal 106A) of the main transistor 104A results in a low pass RC filter based on R1A and parasitic capacitances at the gate node. In this manner, the first path 114A provides a noise isolation path that suppresses gate noise of the main transistor 104A, resulting in very low THD (e.g., less than 1%).

With regard to the second path 116A, a diode-connected transistor (the transistor is labeled MP, where D1 is connected across its current terminals) and R2A are used to provide automatic fast charging during the off-to-on transition of the main transistor 104A. The second path 116A operates without any control signal, and R2A is selected for current limiting so that the output of the charge pump 112A does not drop significantly when the main transistor 104A is turned on.

With regard to the discharge path 118A, R3A and Q1A are used to provide fast discharging during the on-to-off transition of the main transistor 104A. Accordingly, the turn-off time is faster than a desired threshold. With regard to the noise isolation path 202, R4A is selected to match R1A to attenuate charge pump ripple, where the values of R1A and R4A are selected to reduce THD to below a threshold level.

Figure 3:
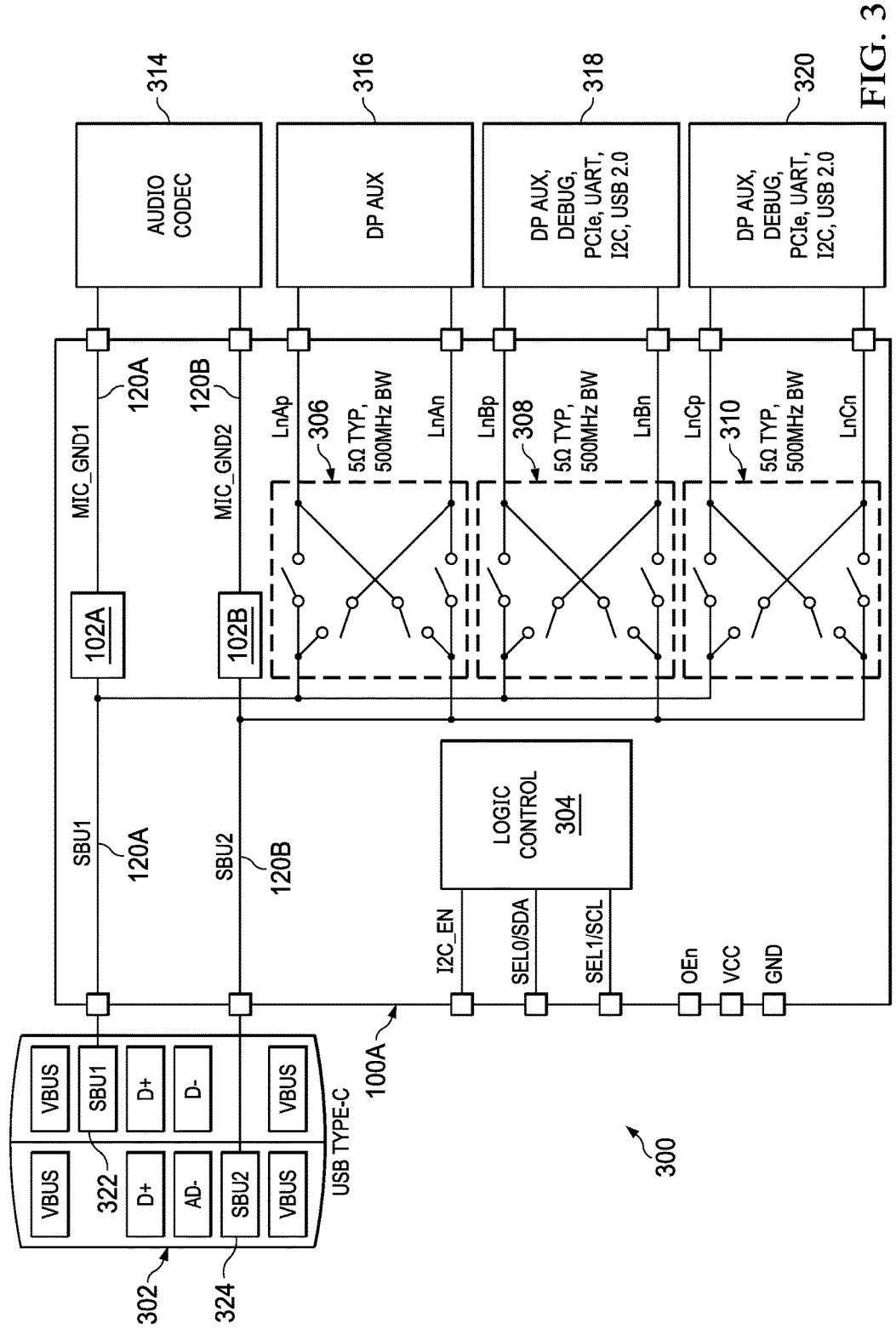
FIG. 3 shows a block diagram of a Universal Serial Bus (USB) Type-C scenario having a sideband use (SBU) mux device with switch arrangements in accordance with various examples.

FIG. 3 shows a block diagram of a Universal Serial Bus (USB) Type-C scenario 300 having an SBU multiplexer (mux) device 100A (an example of the electrical device 100 in FIG. 1) with switch arrangements 102A and 102B in accordance with various examples. The SBU mux device 100A is a passive multiplexer device supporting various types of differential or single-ended signals on the SBU1/SBU2 terminals of a USB Type-C connector 302 to different interfaces 314, 316, 318, and 320. In some examples, the supported signals include differential DisplayPort (DP) auxiliary signals (labeled DP AUX) corresponding to the interface 316, where the interface 316 couples to the SBU terminals 322 and 324 of the connector 302 via a differential switch arrangement 306. Other supported signals include analog audio microphone (MIC) signals corresponding to the audio codec interface 314, where the interface 314 couples to the SBU terminals 322 and 324 of the connector 302 via the switch arrangements 102A and 102B. Meanwhile, each of the interfaces 318 and 320 support various signals such as DP AUX signals, PCIe (Peripheral Component Interconnect Express) signals, debug signals, UART (universal asynchronous receiver-transmitter) signals, I2C (inter-integrated circuit) signals, and USB 2.0 signals. As shown, the interface 318 couples to the SBU terminals 322 and 324 of the connector 302 via differential switch arrangement 308. Meanwhile, the interface 320 couples to the SBU terminals 322 and 324 of the connector 302 via differential switch arrangement 310.

The SBU mux device 100A also includes logic control block 304, which provides controls signals for the switch arrangements 102A, 102B, and the differential switch arrangements 306, 308, and 310. Such control signals are based on trigger events such as coupling a headset to the connector 302 or initiating a particular application or application feature on a computer system or other consumer product.

For the SBU mux device 100A, the signal lines 120A and 120B correspond to audio signal lines, where the switch arrangements 102A and 102B have R_ON below a threshold (e.g., 60 ohms), THD below a threshold (e.g., 0.008%), and bandwidth above a threshold (e.g., 500 MHz). Accordingly, the switch arrangements 102A and 102B prevent signal distortion during audio signal transfer from one channel to another. Also, in some examples, each of the differential switch arrangements 306, 308, and 310 support a bandwidth as high as 500 MHz to provide adequate support for DP AUX signals, a PCIe clock, and/or other similar signals. The SBU mux device 100A is a component of a larger system such as a computer system or mobile device.

Figure 4:
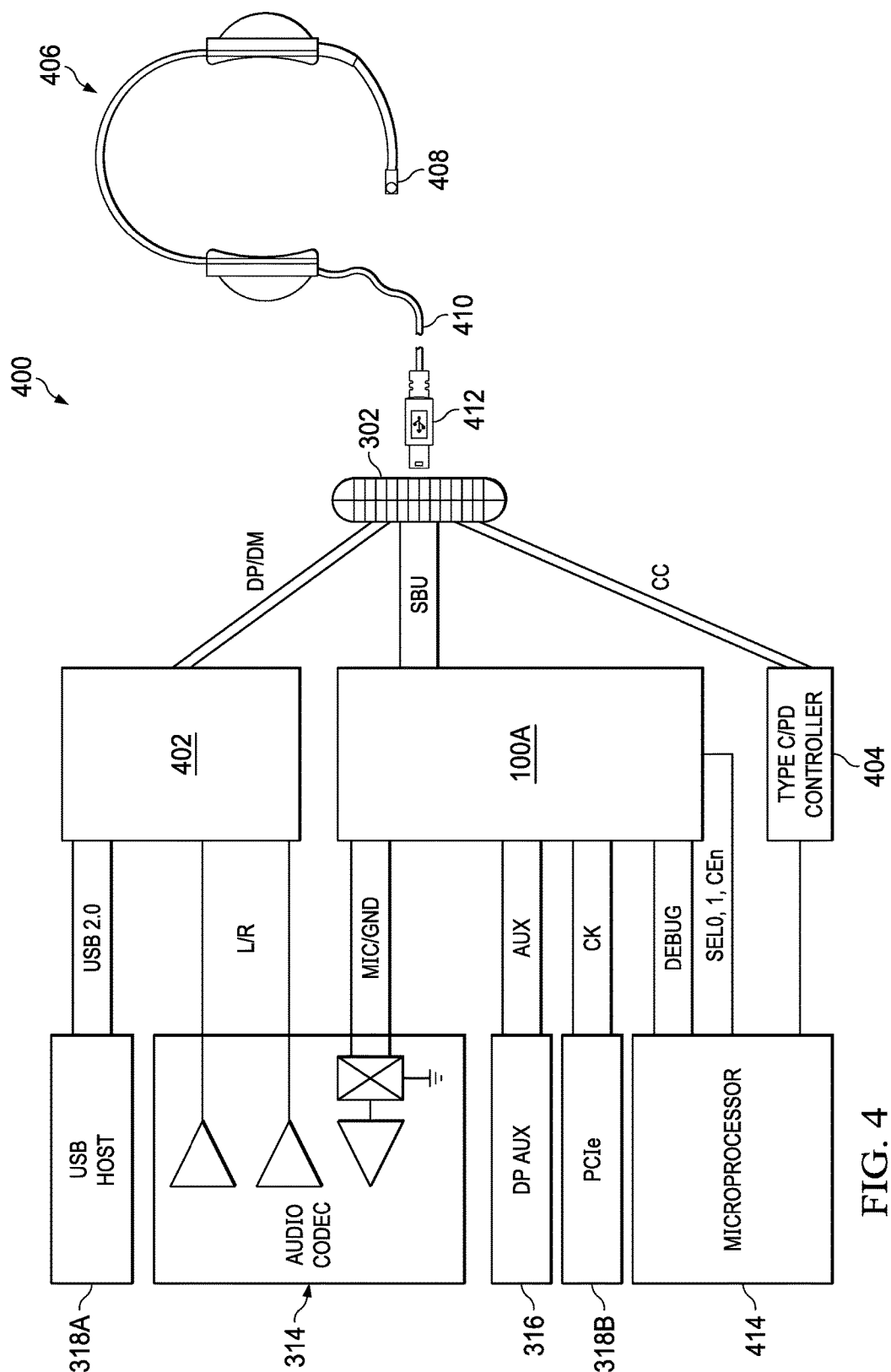
FIG. 4 shows a block diagram of a system with a USB Type-C port and the SBU mux device of FIG. 3 in accordance with various examples.

FIG. 4 shows a block diagram of a system 400 with a USB Type-C port 302 and the SBU mux device 100A of FIG. 3 in accordance with various examples. In different examples, the system 400 corresponds to a computer system or mobile device with the USB Type-C connector 302 and the SBU mux device 100A. Besides the USB Type-C connector 302 and the SBU mux device 100A, the system 100 also includes a USB Type-C controller 404, and another mux device 402 for USB signal lines (labeled DP and DM). As shown, the mux device 402 couples to a USB host interface 318A (e.g., the interface 318 in FIG. 3 corresponds to multiple interfaces 318A and 318B in FIG. 4) and to the audio codex interface 314. Meanwhile, the SBU mux device 100A couples to the audio codec interface 314, the DP AUX interface 316, a PCIe interface 318B, and to a microprocessor 414. The USB Type-C controller 404 also couples to the microprocessor 414. In some examples, the microprocessor 414 directs USB 3.0 Type-C operations and/or performs debug operations as needed.

As represented in FIG. 4, a headset 406 with a microphone 408 is selectively coupled to the USB Type-C connector 302 via a cable 410 and a compatible connector 412. When the headset 406 is coupled to the USB Type-C connector 302 and/or when an application is running that makes use of a microphone such as the microphone 308, the SBU mux device 100A is directed to provide continuous signal lines for audio signals (e.g., the signals lines 120A and 120B represented in FIG. 3 correspond to audio signal lines). In other words, each switch arrangement 102A and 102B represented in FIG. 3 is closed (by providing charge to respective control terminals of respective main transistors as described herein) when the headset 406 is coupled to the USB Type-C connector 302 and/or when an application is running that makes use of a microphone such as the microphone 308. Otherwise, the switch arrangements 102A and 102B of the SBU mux device 100A represented in FIG. 4 remain open.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. For example, the disclosed switch arrangements (e.g., switch arrangements 102A-102N in FIG. 1, or switch arrangement 200 in FIG. 2) are usable in other scenarios besides the USB 3.0 Type-C with SBU mux device scenario represented in FIGS. 3 and 4. It is intended that the following claims be interpreted to embrace all such variations and modifications.

What is claimed is:

1. An apparatus that comprises:
a switch arrangement for a signal line, the switch arrangement comprising:
   a transistor with a control terminal, a first current terminal, and a second current terminal;
   a charge pump coupled to the control terminal of the transistor via first and second paths, wherein the first path comprises a first resistor, wherein the second path comprises a second resistor in series with a diode, and wherein the first resistor has a higher resistance value than the second resistor.

2. The apparatus of claim 1, wherein the first resistor has a resistance value that is at least 100 times greater than a resistance value of the second resistor.

3. The apparatus of claim 1, wherein the transistor is a first transistor, wherein the second path comprises a second transistor with a control terminal, a first current terminal, and a second current terminal, and wherein the diode couples across the first and second current terminals of the second transistor.

4. The apparatus of claim 3, where the apparatus further comprises a discharge path coupled to the control terminal of the first transistor, wherein the discharge path comprises a third resistor and a third transistor, wherein the third resistor couples to a first current terminal of the third transistor, and wherein the second current terminal of the third transistor couples to a ground node.

5. The apparatus of claim 4, wherein first resistor has a resistance value that is at least 65 times greater than a resistance value of the third resistor.

6. The apparatus of claim 4, further comprising a fourth resistor coupled to the charge pump and a body of the first transistor.

7. The apparatus of claim 4, wherein the fourth resistor has a resistance value that is approximately the same as a resistance value of the first resistor.

8. The apparatus of claim 1, wherein a resistance value for the first resistor is selected to reduce total harmonic distortion (THD) to below a predetermined threshold.

9. The apparatus of claim 1, wherein a resistance value for the second resistor is selected such that a turn-on time for the transistor in below a threshold.

10. The apparatus of claim 4, wherein a resistance value for the third resistor is selected such that a turn-off time for the transistor is below a threshold.

11. A multiplexer device that comprises:
a signal line;
a switch arrangement for the signal line, wherein the switch arrangement comprises:
   a transistor with a control terminal, a first current terminal, and a second current terminal;
   a charge pump coupled to the control terminal of the transistor via first and second paths, wherein the first path comprises a first resistor, wherein the second path comprises a second resistor in series with a diode, and wherein the first resistor has a higher resistance value than the second resistor.

12. The multiplexer device of claim 11, wherein the transistor is a first transistor, wherein the second path comprises a second transistor with a control terminal, a first current terminal, and a second current terminal, and wherein the diode couples across the first and second current terminals of the second transistor.

13. The multiplexer device of claim 12, where the switch arrangement further comprises a discharge path coupled to the control terminal of the first transistor, wherein the discharge path comprises a third resistor and a third transistor, wherein the third resistor is coupled between a control terminal of the respective first transistor and a first current terminal of the third transistor, and wherein the second current terminal of the third transistor couples to a ground node.

14. The multiplexer device of claim 13, wherein the first resistor has a resistance value that is at least 100 times greater than a resistance value of the second resistor and at least 65 times greater than a resistance value of the third resistor.

15. The multiplexer device of claim 13, wherein the resistance value for the first resistor is selected to reduce total harmonic distortion (THD) to below a predetermined threshold, wherein a resistance value for the second resistor is selected such that a turn-on time for the first transistor is below a first threshold, and wherein a resistance value for each third resistor is selected such that a turn-off time for the first transistor is below a second threshold.

16. The multiplexer device of claim 11, wherein the multiplexer device is sideband use (SBU) mux compatible with a USB Type-C port, wherein the at least one signal line comprises a sideband use (SBU) line, and wherein each switch is configured to provide an on resistance below 60 ohms, a total harmonic distortion below 0.008%, and a bandwidth above 500 MHz.

17. An apparatus that comprises:
a signal line; and
a switch arrangement for the signal line, wherein the switch arrangement comprises:
  a transistor with a control terminal, a first current terminal, and a second current terminal; and
  a charge pump coupled to the control terminal of the transistor via a noise isolation path in parallel with one-way charging path having a lower resistance than the noise isolation path.

18. The apparatus of claim 17, wherein the noise isolation path comprises a first resistor, wherein the one-way charging path comprises a second resistor in series with a diode, and wherein the first resistor has a higher resistance value than the second resistor.

19. The apparatus of claim 18, wherein the transistor comprises a first transistor, and wherein the apparatus further comprises a discharge path coupled to the control terminal of the first transistor, wherein the discharge path comprises a third resistor and second transistor.

20. The multiplexer device of claim 19, wherein the first resistor has a resistance value that is at least 100 times greater than a resistance value of the second resistor and at least 65 times greater than a resistance value of the third resistor.

* * * * *